(12) United States Patent
Chung et al.

(10) Patent No.: US 6,894,315 B2
(45) Date of Patent: May 17, 2005

(54) STRUCTURE OF LIGHT-EMITTING DIODE ARRAY MODULE

(75) Inventors: Huai Ku Chung, Hsinchu (TW); Chih Hung Chuang, Hsinchu (TW); Shun Lih Tu, Hsinchu (TW); Chien Chen Hung, Hsinchu (TW)

(73) Assignee: Opto Tech Corp., Hsinchu (TW)

( * ) Notice: Subject to any disclaimer, the term of this patent is extended or adjusted under 35 U.S.C. 154(b) by 178 days.

(21) Appl. No.: 10/640,478

(22) Filed: Aug. 12, 2003

(65) Prior Publication Data

US 2005/0035358 A1 Feb. 17, 2005

(51) Int. Cl.⁷ .............................................. H01L 33/00

(52) U.S. Cl. ....................................................... 257/88

(58) Field of Search .............................. 257/79, 80, 81, 257/82, 83, 84, 88, 91, 99, 117, 118

(56) References Cited

U.S. PATENT DOCUMENTS 6,621,105 B2 * 9/2003 Taninaka et al. .............. 257/88

* cited by examiner

Primary Examiner—Long Pham
Assistant Examiner—Dana Farahani

(57) ABSTRACT

The present invention discloses a structure of light-emitting diode (LED) array module, comprising a substrate, a carrier substrate, a chip, a driving circuit chip, and a plurality of metal lines. The carrier substrate is on top of the substrate, and the top surface of the carrier substrate is divided into a first area and a second area. The chip is attached to the first area of the carrier substrate, and further comprising a light-emitting component array and a pad array. The driving circuit chip is attached to the second area of the carrier substrate, and further comprising a pad array and a pad. The metal lines are for electrically connecting the substrate to the driving circuit chip, and the chip to the driving circuit chip, respectively. The present invention can reduce the manufacturing cost, and improve the yield rate.

10 Claims, 8 Drawing Sheets

(PARIOR ART)

(PARIOR ART)

STRUCTURE OF LIGHT-EMITTING DIODE ARRAY MODULE

FIELD OF THE INVENTION

This invention relates to a structure of a light-emitting diode array module and, more particularly, to a structure of a light-emitting diode array module to be used in the head of a printer.

BACKGROUND OF THE INVENTION

The light-emitting diode (LED) army is widely used in the heads of printers or photocopy machines. As shown in FIG. 1, a typical printer head with LEDs comprises an optical lens 71, for focusing the light from the LEDs, and a light source area 72, equipped with LED array components and optical components, for emitting light to penetrate the optical lens 71 and project unto the corresponding location on the photo conductor drum 70 of the printer. The projection, combined with the subsequent operations constitutes the printing of the desired patterns.

FIG. 2 shows a schematic diagram of a conventional structure using LED as light source. The structure comprises a printed circuit board (PCB) 81, a plurality of LED chip arrays 82, arranged end-to-end to cover the entire length of the printer head, and installed on the surface of the PCB 81, and a plurality of driving devices 83, arranged in a line parallel to the LED chip arrays, and also installed on the surface of the PCB 81. The wire bonding 84 is used to electrically connect the driving devices 83 and the LED chip arrays 82, and the wire bonding 85 is to electrically connect the driving devices 83 to the conductive pattern on the PCB 81 to generate the required light source. However, there are several drawbacks in manufacturing the above structure:

1. Low yield rate: In the LED chip arrays 82, the individual LED has a small light emitting area, and the component density is high. For example, for a resolution of 600 dpi, it requires a light emitting area with 5000 LEDs. Furthermore, it also needs to wire bond from the bond pad on the LED chip arrays 82. That is, it needs to wire 5000 times in order to complete the 5000 wire bonding 84. Under such circumstances, because of the large number of wires and their high density and accuracy, and the difficulty of fixing a plurality of LED chip arrays 82 on the PCB 81, it is difficult to control the precision. Therefore, the yield rate of the manufacturing is usually low.
2. High production cost: The test can only begin after the above structure is complete, that is, after 5000 wiring. If there is any defect, it is difficult to replace the defect components since they are densely arranged. In this case, most products with any defects will be thrown away. Therefore, the average production cost is high.
3. High investment cost: Because the LED chip arrays must be aligned precisely along the same axis, it requires a high precision equipment, which means a higher investment cost.

In summary, the unit cost of the product is high because it is hard to alleviate the above three drawbacks.

SUMMARY OF THE INVENTION

The first objective of the present invention is to provide a structure of an LED array module to reduce the production cost. The structure provides at least a carrier substrate with a preformed shape that could accurately accommodate the LED chip arrays and the driving devices. The test can also be performed in advance to improve the yield rate and reduce the manufacturing cost.

To achieve the aforementioned objective, the present invention comprises a substrate, a carrier substrate, chips, driving circuit chips, and a plurality of metal lines for electrical connection. The carrier substrate is located on top of the substrate, with a lateral raised stripe at the top. The chips and the driving circuit chips are placed on the opposite side of the raised stripe. The chip comprises a light-emitting diode array and a pad array. A plurality of metal lines electrically connects the pad arrays of the chips and the driving circuit chips. The driving circuit chips are used to drive the LEDs of the light-emitting array. There are pad areas on the top of the driving circuit chips in addition to the pad array. The pad areas are electrically connected to the substrate to form a complete loop.

Compared to the prior arts, the present invention provides the following advantages:

1. lower manufacturing cost: unlike prior arts that need to align thousands of LEDs accurately along the same axis, the present invention only needs to align and assemble a few carrier substrates with pre-wired LED array. Because of this, the high precision manufacturing equipment can be replaced by a low precision, but less expensive, equipment, or even by manual assembly.
2. higher yield rate: with the carrier substrate, the test can starts as soon as the chips and the driving circuit chips are glued to the carrier substrate and wired. The defects can be thrown away immediately. If the defect occurs when the carrier substrate is placed on the substrate, it is easier to replace the carrier substrate because the carrier substrate is glued to the substrate at a low temperature. The replacement of a carrier substrate at a low temperature will not affect the neighboring areas and components. Therefore, the yield rate is higher.
3. Reduction of unnecessary waste: The early defects can be thrown away at the test after the completion of wiring the carrier substrate. This avoids the propagation of the defect to a later stage that would result in an unnecessary waste.
4. Shortened manufacturing cycle: because the lateral raised stripe on the carrier substrate can help aligning the chips and the driving circuit chips during manufacturing, the alignment can be done faster and more accurately. This shortens the manufacturing cycle.
5. Competitiveness: the present invention can reduce the manufacturing cost, improve yield rate, while sustain high manufacturing precision and low maintenance cost, therefore, the product is more competitive in the market.

These and other objects, features and advantages of the invention will be apparent to those skilled in the art, from a reading of the following brief description of the drawings, the detailed description of the preferred embodiment, and the appended claims.

DETAILED DESCRIPTION OF THE INVENTION

Figure 1:
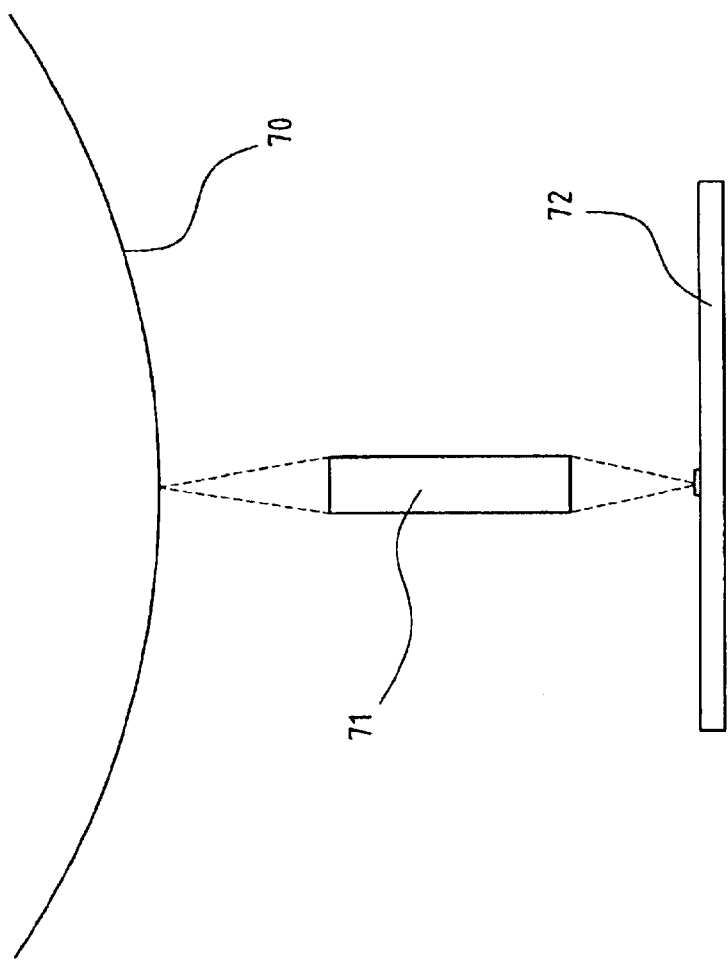
FIG. 1 shows a schematic diagram of a conventional printer head using LEDs.
Figure 2:
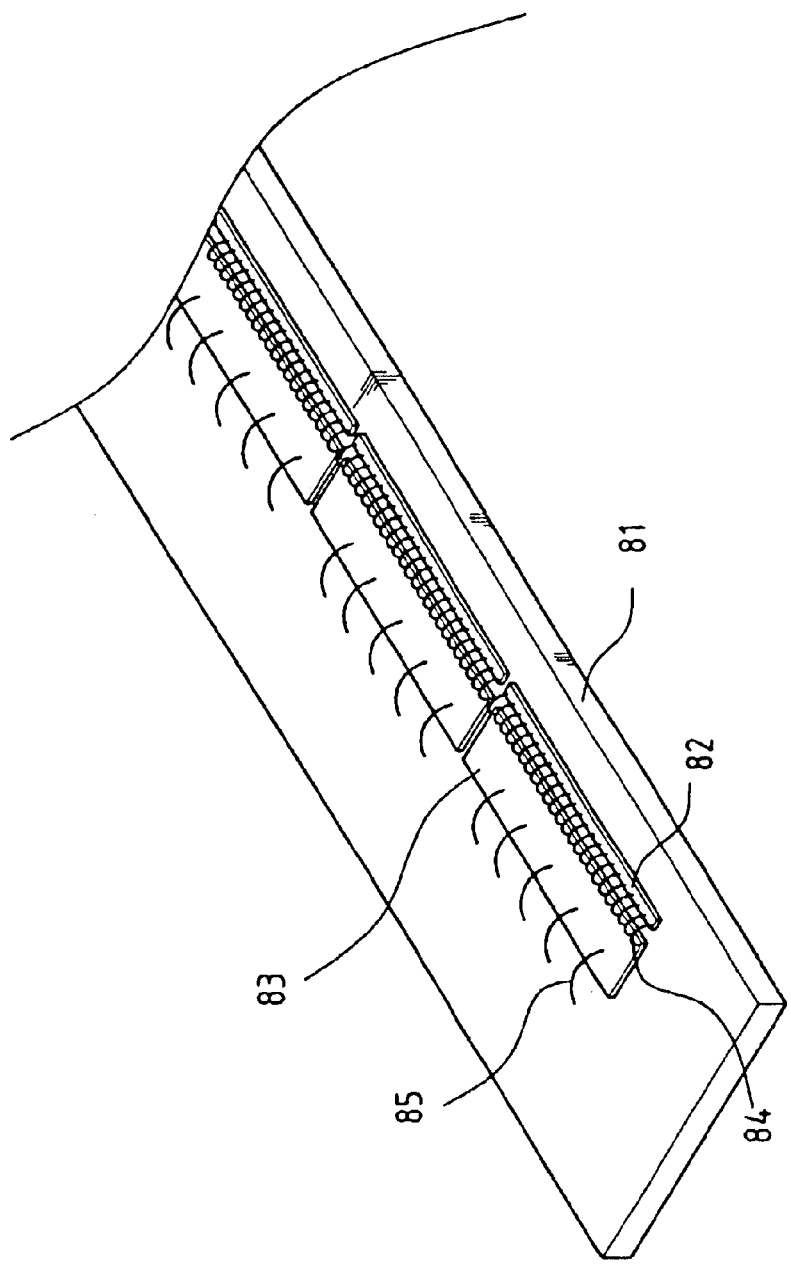
FIG. 2 shows a schematic diagram of a conventional structure using LEDs as light source.
Figure 3:
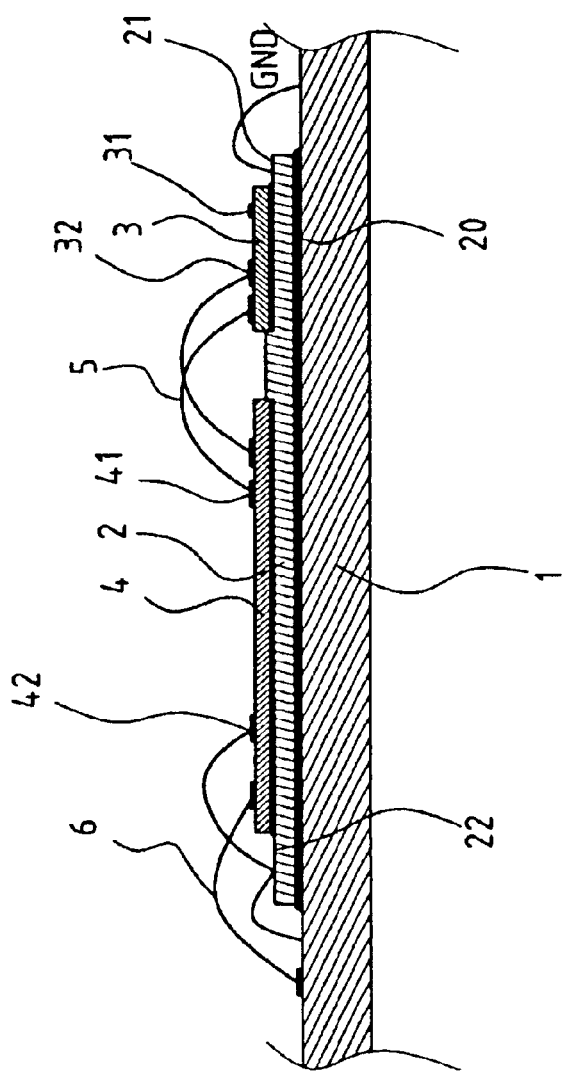
FIG. 3 shows a schematic diagram of a cross-sectional view of the present invention.
Figure 4:
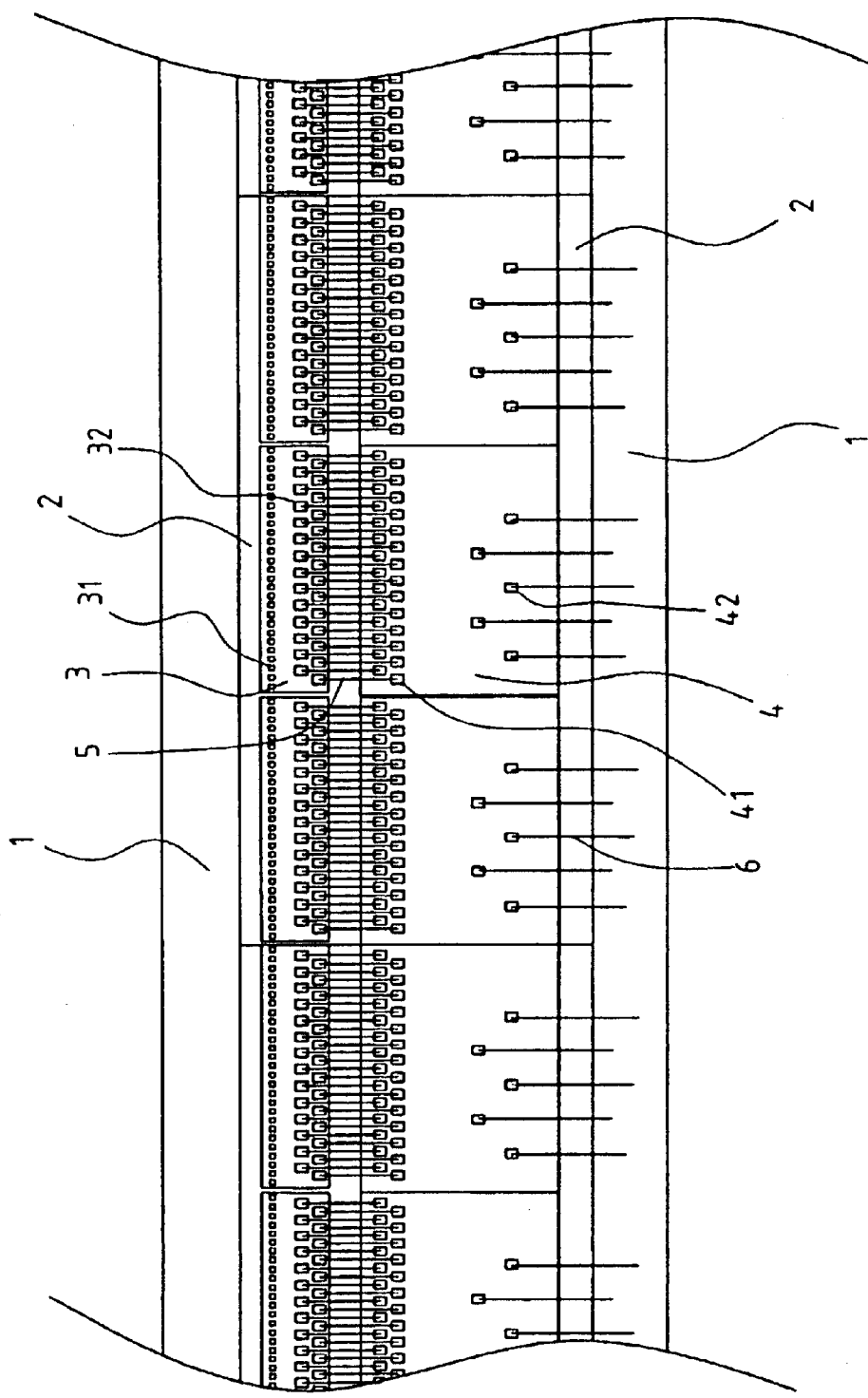
FIG. 4 shows a schematic diagram of a plan view of the present invention.

FIG. 3 and FIG. 4 show the cross-sectional view and the plan view of the present invention, respectively. The present invention comprises a substrate 1, a carrier substrate 2, a plurality of chips 3, a plurality of driving circuit chips 4, and a plurality of metal lines 5, 6 for electrical connection. The substrate 1 can be a PCB, a ceramic substrate, or made of other material suitable for circuits. The carrier substrate 2 is placed on top of the substrate 1 for accommodating the chips 3 and the driving circuit chips 4. The carrier substrate 2 is attached to the substrate 1 with low temperature glue 20, and the number of the carrier substrates depends on the number of LEDs.

Figure 5:
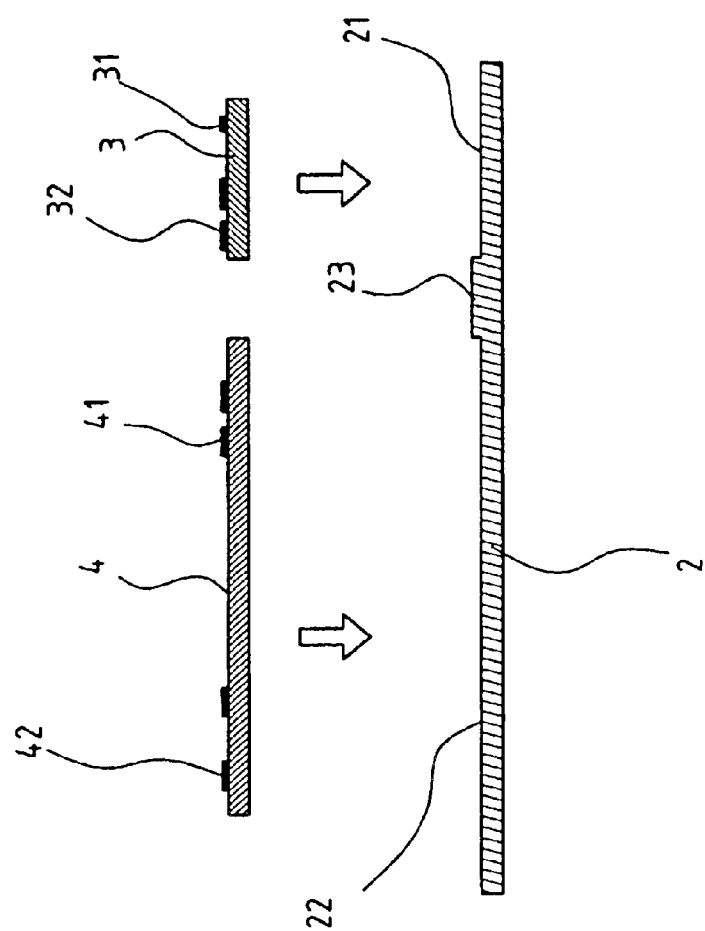
FIG. 5 shows a schematic diagram of an embodiment of a carrier substrate, a chip and a driving circuit chip prior to assembly.
Figure 6:
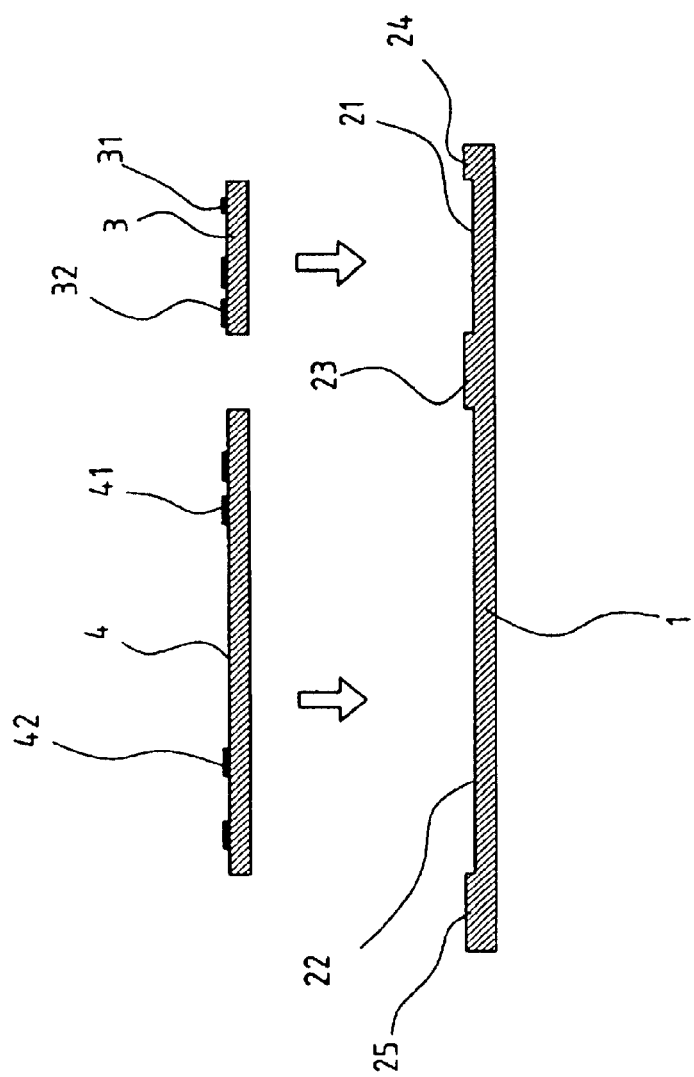
FIG. 6 shows a schematic diagram of another embodiment of a carrier substrate, a chip and a driving circuit chip prior to assembly.

As shown in FIG. 5, the top surface of the carrier substrate 2 is divided into two areas—a first area 21, and a second area 22. The first area 21 is for the chips 3 to be glued on, and the second area 22 is for the driving circuit chips 4. To enable a faster alignment of chips 3 and driving circuit chips 4, the carrier substrate comprises a lateral raised stripe 23. Both the chips 3 and the driving circuit chips 4 can be put against the raised stripe 23, so that the alignment can be faster and more accurate. As shown in FIG. 6, another embodiment of the present invention further comprises raised stripes 24, 25 on both sides. This structure further improves the placement and alignment of the chips 3 and the driving circuit chips 4 on the carrier substrate 2. The carrier substrate 2 can be made of silicon or other material suitable to form such shapes, and using etching process to form the areas for placing the chips 3 and the driving circuit chips 4. The structure of the carrier substrate 2 enables the manual placement and alignments of the chips 3 and the driving circuit chips 4 to the carrier substrate 2.

The chips 3 are source for light emitting. The surface of the chip 3 comprises at least a light-emitting component array 31 and a pad array 32. The light-emitting component array 31 further comprises a plurality of LEDs, with the corresponding number of pads in the pad array 32. The driving circuit chip 4 is for driving the LEDs. A pad array 41 and pad areas 42 are formed on the top surface of the driving circuit chip 4. The number of the pads in the pad array 41 is equivalent to the number in the pad array 32 of the chip 3. The pad areas 42 are for electrical connection to the substrate 1 so that the signal can be transmitted from the substrate 1 to the driving circuit chip 4. The metal lines 5 are to electrically connect the pad array 31 of chip 3 and the pad array 41 of driving circuit chip 4, and the metal lines 6 are to electrically connect the substrate 1 and the pad areas 42 of driving circuit chip 4 so that a complete loop is formed.

According to the present invention, the placement and alignment of the chips 3 and the driving circuit chips 4 can be done manually because of the special design of the carrier substrate. This reduces the production cost. In addition, a carrier substrate can accommodate a plurality of chips 3 and a plurality of driving circuit chips 4, for example, 3 of each in this embodiment. Furthermore, after the placement and the wiring of the chips, and prior to attaching the carrier substrate 2 to the substrate 1, some tests can be done on the carrier substrate 2, and the defects can be thrown away immediately to avoid the propagation of the defects to a later stage of manufacturing. If a defect is found after the carrier substrate 2 is attached to the substrate 1, the carrier substrate 2 can also be easily replaced because it uses low temperature glue. Replacing a carrier substrate 2 at a low temperature will not damage the neighboring areas. Also, by reducing the number of LEDs on each carrier substrate 2, for example, from 5000 to 1000, the precision requirement for wiring could be lowered. Therefore, the investment of high precision equipment can be also lowered.

In summary, the present invention of a structure allows a manufacturing process that provides a fast alignment and placement of chips at the early stage, early detects of defects at the middle stage to avoid waste, and using a lower cost equipment at the late stage to achieve high precision tasks. Therefore, the product is competitive in the market.

Figure 7:
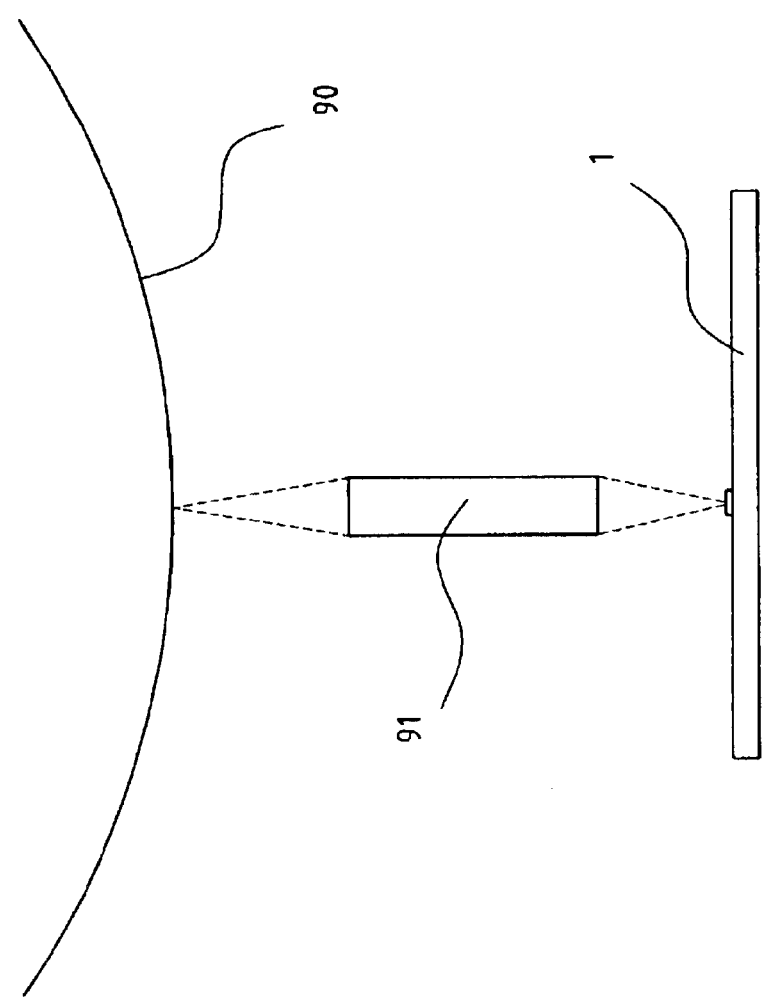
FIG. 7 shows a schematic diagram of a printer head using the present invention.

As shown in FIG. 7, the present invention can be used in the printer head. The present invention can be used as the light source of a printer. An optical lens 91 is used to focus the light emitted by the present invention, and to project the light onto the image drum 90. In a preferred embodiment, the optical lens is a rod lens array.

Figure 8:
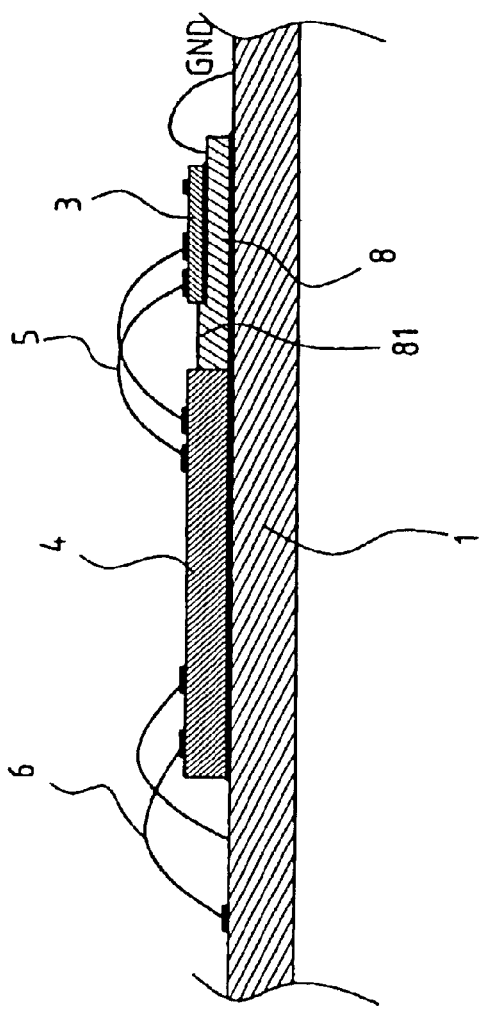
FIG. 8 shows a schematic diagram of a cross-sectional view of another embodiment of the present invention.

FIG. 8 shows a cross-sectional view of another embodiment of the present invention. The carrier substrate 8 has a different shape in this embodiment. Also, unlike in the previous embodiment, only chips 3 are attached to the carrier substrate 8, while the driving circuit chip 4 is directly attached to the substrate 1. Similarly, there is a lateral raised stripe 81 at the top of the carrier substrate 8 for easy alignment, as in previous embodiment. Furthermore, as the size of the carrier substrate 8 can be shrunk, the production cost can be even further reduced.

While the invention has been described in connection with what is presently considered to the most practical and preferred embodiment, it is to be understood that the invention is not to be limited to the disclosed embodiment, but, on the contrary, it should be clear to those skilled in the art that the description of the embodiment is intended to cover various modifications and equivalent arrangement included within the spirit and scope of the appended claims.

What is claimed is:

1. A structure of light-emitting diode (LED) array module, comprising:
   a substrate,
   a carrier substrate, on top of said substrate, the top surface of said carrier substrate being divided into a first area and a second area,
   a chip, attached to said first area of said carrier substrate, further comprising a light-emitting component array and a pad array,
   a driving circuit chip, attached to said second area of said carrier substrate, further comprising a pad array and a pad area, and
   a plurality of metal lines, for electrically connecting said substrate to said driving circuit chip, and said chip to said driving circuit chip, respectively.

2. The structure as claimed in claim 1, wherein said light-emitting component array comprises a plurality of LEDs.

3. The structure as claimed in claim 1, wherein said substrate is a printed circuit board.

4. The structure as claimed in claim 1, wherein said carrier substrate is made of silicon.

5. The structure as claimed in claim 1, wherein said carrier substrate comprises a lateral raised stripe at the top, and said chip and said driving circuit chip are placed on the opposite sides of said stripe, and against said stripe.

6. The structure as claimed in claim 1, wherein said aid carrier substrate comprises 3 lateral raised stripes at the top, and said chip and said driving circuit chip are placed at the lower areas between two said stripes, respectively.

7. The structure as claimed in claim 1, wherein said carrier substrate is formed with a semiconductor or the material etching process.

8. The structure as claimed in claim 1, wherein said carrier substrate uses a low temperature glue to attach to said substrate.

9. The structure as claimed in claim 1, wherein said module can be used in the head of a printer.

10. A structure of light-emitting diode (LED) array module, comprising:

a substrate, a carrier substrate, on top of said substrate, the top surface of said carrier substrate having a raised stripe, a chip, attached to the top surface of said carrier substrate, aligned along said raised stripe, further comprising a light-emitting component array and a pad array, a driving circuit chip, attached to said substrate, further comprising a pad array and a pad area, and a plurality of metal lines, for electrically connecting said substrate to said driving circuit chip, and said chip to said driving circuit chip, respectively.

* * * * *